United States Patent
Shih et al.

(10) Patent No.: US 8,292,698 B1
(45) Date of Patent: Oct. 23, 2012

(54) ON-LINE CHAMBER CLEANING USING DRY ICE BLASTING

(75) Inventors: Hong Shih, Walnut, CA (US); Oana M. Leonte, Hayward, CA (US); John E. Daugherty, Fremont, CA (US); Tuochuan Huang, Saratoga, CA (US); Gregory J. Goldspring, Alameda, CA (US); Michael C. May, Gardiner, NY (US)

(73) Assignee: Lam Research Corporation, Fremont, CA (US)

( * ) Notice: Subject to any disclaimer, the term of this patent is extended or adjusted under 35 U.S.C. 154(b) by 1260 days.

(21) Appl. No.: 11/730,299

(22) Filed: Mar. 30, 2007

(51) Int. Cl.
*B24B 1/00* (2006.01)
*B24C 1/00* (2006.01)
(52) U.S. Cl. .................. 451/39; 451/37; 451/57
(58) Field of Classification Search .............. 451/39, 451/37, 57
See application file for complete search history.

(56) References Cited

U.S. PATENT DOCUMENTS

| | | | |
|---|---|---|---|
| 5,356,478 A | 10/1994 | Chen et al. | |
| 6,004,400 A | 12/1999 | Bishop et al. | |
| 6,036,786 A * | 3/2000 | Becker et al. | 134/2 |
| 6,790,289 B2 | 9/2004 | Takase et al. | |
| 6,897,161 B2 * | 5/2005 | Suzuki | 438/746 |
| 6,945,853 B2 | 9/2005 | Ahmadi et al. | |
| 6,983,892 B2 | 1/2006 | Noorbakhsh et al. | |
| 7,091,133 B2 * | 8/2006 | Goundar et al. | 438/758 |
| 7,101,260 B2 * | 9/2006 | Tannous et al. | 451/37 |
| 7,134,941 B2 * | 11/2006 | Boumerzoug et al. | 451/39 |
| 2002/0006766 A1 * | 1/2002 | Haerle et al. | 451/39 |
| 2003/0119423 A1 * | 6/2003 | Gabzdyl et al. | 451/39 |
| 2003/0148710 A1 * | 8/2003 | Esser et al. | 451/39 |
| 2003/0221702 A1 | 12/2003 | Peebles | |
| 2005/0172984 A1 * | 8/2005 | Schweitzer et al. | 134/26 |
| 2005/0215445 A1 * | 9/2005 | Boumerzoug et al. | 510/175 |
| 2005/0224458 A1 | 10/2005 | Gaudet et al. | |
| 2006/0138081 A1 | 6/2006 | Huang et al. | |
| 2006/0141787 A1 | 6/2006 | Ren et al. | |
| 2006/0141802 A1 | 6/2006 | Shih et al. | |
| 2007/0032072 A1 * | 2/2007 | Sidhwa | 438/653 |

* cited by examiner

*Primary Examiner* — Joseph J Hail
*Assistant Examiner* — Alvin Grant
(74) *Attorney, Agent, or Firm* — Buchanan Ingersoll & Rooney PC

(57) ABSTRACT

An on-line method of cleaning contaminants from at least one interior surface in plasma chambers comprises blasting one or more interior surfaces of a plasma chamber with dry ice to remove contaminants from the one or more surfaces.

20 Claims, 4 Drawing Sheets

100        200

ON-LINE CHAMBER CLEANING USING DRY ICE BLASTING

SUMMARY

Provided is an on-line method of cleaning contaminants from at least one interior surface in plasma chambers, the method comprising opening a plasma chamber and blasting one or more interior surfaces of the plasma chamber with dry ice. The blasting removes contaminants from the one or more surfaces, and the cleaning is carried out at a site at which the plasma chamber is regularly operated.

BRIEF DESCRIPTION OF THE DRAWING FIGURE

DETAILED DESCRIPTION

Figure 1:
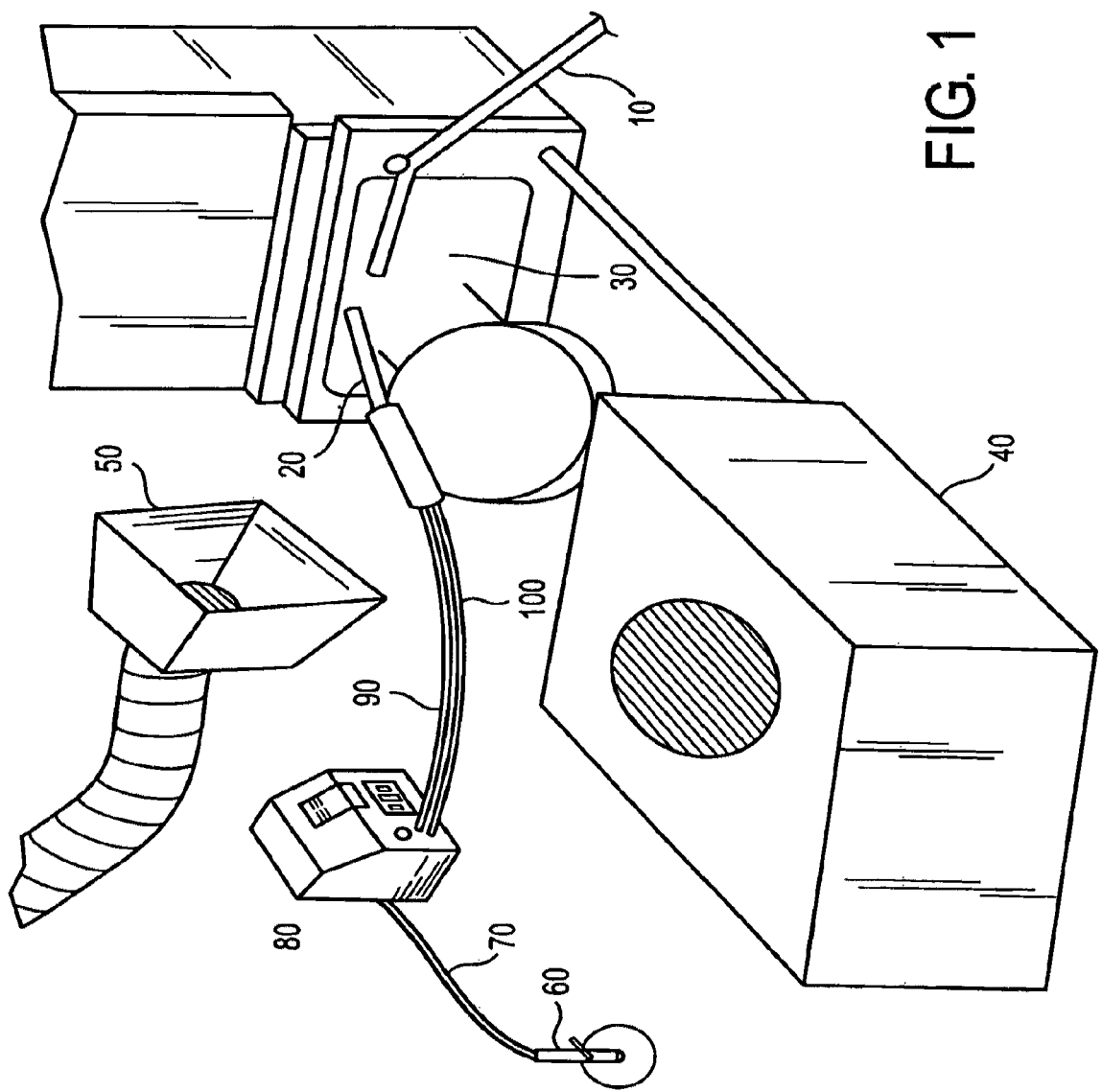
FIG. 1 illustrates a typical schematic set up for the presently disclosed on-line chamber cleaning.

An on-line method of cleaning contaminants from at least one interior surface in plasma chambers comprises blasting one or more interior surfaces of a plasma chamber with dry ice to remove contaminants from the one or more surfaces.

Carbon dioxide ($CO_2$) "dry ice" pellet technology uses compressed air to accelerate frozen "dry ice" pellets to a high velocity, and thus, deliver via a nozzle arrangement a high velocity stream of non-toxic, non-hazardous, non-explosive, dense carbon dioxide pellets, which typically range in size from about ⅛" to about ¼". The carbon dioxide pellets are shot against surfaces to be cleaned. Upon impact, the dry ice pellets sublimate to a harmless gaseous state (vaporize), and upon removal of the contaminants, the surface is left clean, dry and undamaged.

As used herein, the term "on-line" refers to a process performed at the site of operation of the chamber, and even more specifically, in a cleanroom in which the chamber is regularly operated, such as a process line in semiconductor manufacturing. Thus, at the site of operation of the chamber, the chamber is opened and the on-line process is performed. The chamber may be, for example, a plasma etch chamber, and more specifically, a metal etch chamber, a poly etch chamber, a dielectric etch chamber, a photoresist stripping chamber or other processing chamber.

Off-line cleaning of plasma chambers and plasma chamber components requires disassembly of the plasma etch chamber, transport of plasma chamber components to one or more sites other than that at which the chamber is operated, at which the plasma chamber components will be cleaned, and later transport of the cleaned plasma chamber components back to the site of operation of the chamber and reassembly of the plasma etch chamber. Additionally, off-line cleaning of plasma chambers and plasma chamber components using carbon dioxide dry ice pellet technology typically involves high Clean Dry Air (CDA) pressure, high CDA flow rate, and high noise levels. Further, off-line cleaning results in long Preventative Maintenance (PM) times, or Mean Time To Clean (MTTC), of, for example, greater than 24 hours, greater than 100 hours, or even over 20 days, to completely remove carbon and fluorine based polymer deposits.

In contrast, provided is an on-line method of cleaning contaminants from at least one interior surface in plasma chambers comprising opening a plasma chamber and blasting one or more interior surfaces of the plasma chamber with dry ice, wherein the blasting removes contaminants from the one or more surfaces. As used herein, the phrase "blasting system" refers to equipment that provides dry ice, preferably shaved dry ice, in the presently disclosed cleaning method. Such equipment preferably includes a dry ice source, such as a block of dry ice, means for converting the source of dry ice to dry ice pellets or shavings (e.g., titanium blades that shave dry ice from the dry ice source), air source/inlet, dry ice blast hose connected to the dry ice source, clean dry air hose connected to the clean dry air source, and dry ice blast applicator and nozzle connected to the dry ice blast hose and the clean dry ice hose. Preferably, the conditions of the blasting system used comprise a CDA flow rate, which depends on the nozzle used, of about 12-100 Cubic Feet per Minute (CFM) through the nozzle; CDA pressure of about 25-125 psi, more preferably about 50-100 psi; and maximum blast pressure of about 125 psi. As a result of using relatively low CDA pressure and flow rate, the blasting system is preferably almost noise-free. Use of blasting with dry ice to clean contaminants from interior surfaces in plasma chambers advantageously avoids the use of hazardous cleaning solvents. The cleaning may be performed manually, with an operator manually directing dry ice from a blasting system nozzle to perform the cleaning.

Additional preferred conditions of the blasting system include a dry ice blasting rate of about 0.3-1.0 lbs/min., more preferably about 0.5 lbs/min.; a dry ice outlet nozzle having a blast swath of about 0.125-1 inch, more preferably about 0.25-1 inch, even more preferably about 0.5 inch; and a CDA inlet diameter of about 0.5-1.0 inch, more preferably about 0.5 inch. The CDA inlet provides an entry point for CDA, from a CDA source, to the blasting system. While a dry ice blasting rate of about 0.8-1.0 lbs/min. may provide a cleaning rate of about 15 inch.$^2$/min., deposition of contaminants cleaned from the one or more surfaces on interior surfaces of the plasma chamber caused by the high blasting rate is undesirable. Thus, the blasting preferably provides a cleaning rate of less than about 15 inch.$^2$/min., more preferably about 2-15 inch.$^2$/min., even more preferably about 2-5 inch.$^2$/min, to ensure removal of contaminants from the one or more surfaces, without deposition of the cleaned contaminants on interior surfaces of the plasma chamber.

A preferred blasting system for use according to the presently disclosed method is the i$^3$ MicroClean Dry Ice Precision Blasting Machine, manufactured by Cold Jet®, Loveland, Ohio, which projects dry ice particles shaved from a block of dry ice. Shaved block dry ice (i.e., snow cleaning) produces much finer and more consistently sized particles allowing for more delicate surfaces to be cleaned without damage. Unlike other blasting systems, its low CDA flow rate and ice consumption provides for cost-effective operation in an almost noise-free environment. The dry ice particles disappear on impact. If desired, other blasting systems can be used. For example, a deflector plate can be attached over the blast end of a nozzle to break up pellets with other blasting systems, such as, the AeRO 30 Dry Ice Blasting Machine or AeRO 75 Dry Ice Blasting Machine, both manufactured by Cold Jet®, Loveland, Ohio, to provide dry ice pellets with desired characteristics, such as, for example, pellet size.

The on-line method preferably removes contaminants from stainless steel, ceramic, and/or anodized aluminum surfaces, and more specifically, for example, an anodized aluminum sidewall of the plasma chamber, an anodized aluminum surface of an electrostatic chuck (ESC), and/or a ceramic surface of an electrostatic chuck.

Carbon dioxide dry ice pellet technology is preferably not applied to bonded ceramic surfaces, as the carbon dioxide may cause bonding degradation, and coatings, for example, yttria-oxide coatings, on anodized aluminum or ceramic surfaces, as the carbon dioxide may cause the coating to peel off from an underlying anodized or ceramic surface. Due to thermal shock to very low temperature (e.g., −50° C. to −60° C.) after applying carbon dioxide dry ice pellets, bonded ceramic surfaces and yttria-oxide coatings may be weakened.

As schematically illustrated in FIG. 1, during cleaning, a vacuum hose 10 is preferably positioned with its inlet opening by the side of the dry ice blast applicator and nozzle 20 to remove contaminants cleaned from the one or more surfaces 30 via blasting to avoid deposition of the contaminants on interior surfaces of the opened plasma chamber 40 with RF electrode or antenna removed. Cleanroom exhaust 50 may further assist in the removal of contaminants cleaned from the one or more surfaces via blasting. The dry ice blast applicator and nozzle 20 is connected to the blasting system 80 by dry ice blast hose 90 and air hose 100.

The CDA supply line 60 may have a diameter of, for example, about 0.5-1.5 inch., and a line 70 connecting the CDA supply line 60 to the blasting system 80, more specifically the blasting system CDA inlet (not shown), may have a diameter of, for example, about 0.375-1 inch, preferably about 0.5 inch. Preferably, the blasting system shaves the dry ice from a block of dry ice held within the blasting system (not shown), for example a 6 inch×6 inch×12 inch (15 cm×15 cm×30 cm), 20 lb (9.1 kg) block of 99.9999% pure carbon dioxide dry ice.

While not illustrated, in-line gas filters may be present in the dry ice applicator at the point of use, right before the dry ice outlet nozzle. Additionally, cleanroom compatible plastic bags may cover plasma chamber components to avoid deposition of the contaminants thereon. Control of airborne contaminant particles following removal from the one or more surfaces via blasting is desired not only to avoid deposition of the contaminants on interior surfaces of the plasma chamber, but also because airborne contaminant particle exposure may represent a health hazard to cleaning personnel if not properly equipped with a National Institute for Occupational Safety and Health (NIOSH) airborne particle exposure breathing apparatus.

Off-line cleaning of plasma chambers and plasma chamber components using carbon dioxide dry ice pellet technology has confirmed the effectiveness of using carbon dioxide dry ice pellet technology to clean plasma chambers and plasma chamber components. Similar to off-line cleaning of plasma chambers and plasma chamber components using carbon dioxide dry ice pellet technology, the endpoint of the on-line cleaning of plasma chambers and plasma chamber components using carbon dioxide dry ice pellet technology may be evaluated using cleanroom wipes wetted with isopropyl alcohol or ultra pure water. After full polymer removal from plasma chamber surfaces by blasting, extensive wiping of the blasted surfaces with isopropyl alcohol, ultra pure water, and then again isopropyl alcohol is conducted to fully remove any residual particles on chamber component surfaces. Wiping continues until no removed residual contamination or particles are observed on the cleanroom wipes.

Accordingly, the on-line cleaning method preferably further comprises manually wiping the interior of the plasma chamber with isopropyl alcohol and/or wiping the interior of the plasma chamber with ultra pure water following the blasting. Wiping may be done using, for example, a scour pad, preferably a 3M Scotch-Brite™ pad. Wiping with isopropyl alcohol may verify whether the blasting has been effective in cleaning the interior surfaces of the plasma chamber, as well as remove any loose particles, organics, and/or contaminants, for example, metal contaminants, from interior surfaces of the plasma chamber, while wiping with ultra pure water preferably removes any loose particles, organics, and/or contaminants, for example, metal contaminants, from interior surfaces of the plasma chamber. The contaminants to be removed may comprise polymer deposits, more specifically, carbon and fluorine based polymer deposits. Such polymer deposits may appear in the form of shiny filmy deposits.

While the manual blasting may take about two hours or less, a cleaning including manual wiping with ultra pure water and/or isopropyl alcohol may be completed in eight hours or less. Thus, the Mean Time To Clean (MTTC), or the time that the plasma chamber would not be in use during cleaning, is preferably 48 hours or less, more preferably 16 working hours or less. In particular, when cleaning is performed during workdays having one shift, eight to ten hours long, the MTTC is preferably one to two workdays, while when cleaning is performed during workdays having two to three shifts, each eight to ten hours long, the MTTC is preferably one workday. As the dry ice blasting system is non-abrasive and non-damaging to the plasma chamber interior surface being cleaned, the cleaning results in no surface degradation, while preferably avoiding particle contamination.

An exemplary ESC can comprise a metal base (e.g., anodized aluminum) with a ceramic surface on which a semiconductor or substrate such as a wafer is supported. As an example, the ceramic surface may comprise a sintered laminate comprising a patterned refractory (e.g., tungsten or molybdenum) electrode between two ceramic layers (e.g., thin ceramic layers approximately 20 mils thick). The laminate may be bonded to the metal base with a bonding material such as a silicone based material containing conductive powders (e.g., aluminum, silicon, or the like). The metal base, approximately 1.5 inch. thick, typically includes RF and DC power feeds, through holes for lift pins, helium gas passages, channels for temperature controlled fluid circulation, temperature sensing arrangements, and the like.

Figure 2:
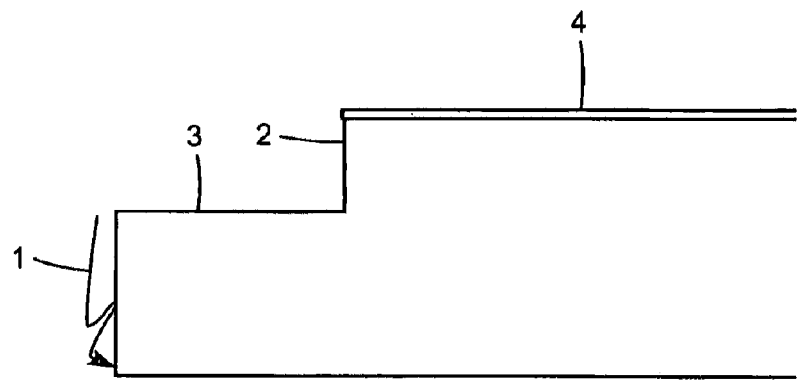
FIG. 2 is a cross-sectional view of an electrostatic chuck (ESC) having an anodized aluminum base, showing exemplary areas of the ESC that may be analyzed before and after the cleaning.

FIG. 2, a cross-sectional view of an ESC having an anodized aluminum base, shows exemplary areas of the ESC that may be analyzed before and after the cleaning. Such areas include a side wall 1 with polymeric deposits to be cleaned, a reference clean rim top edge 2, a rim top 3 where contaminant particles may be redeposited during cleaning, and a ceramic surface 4.

Figure 3:
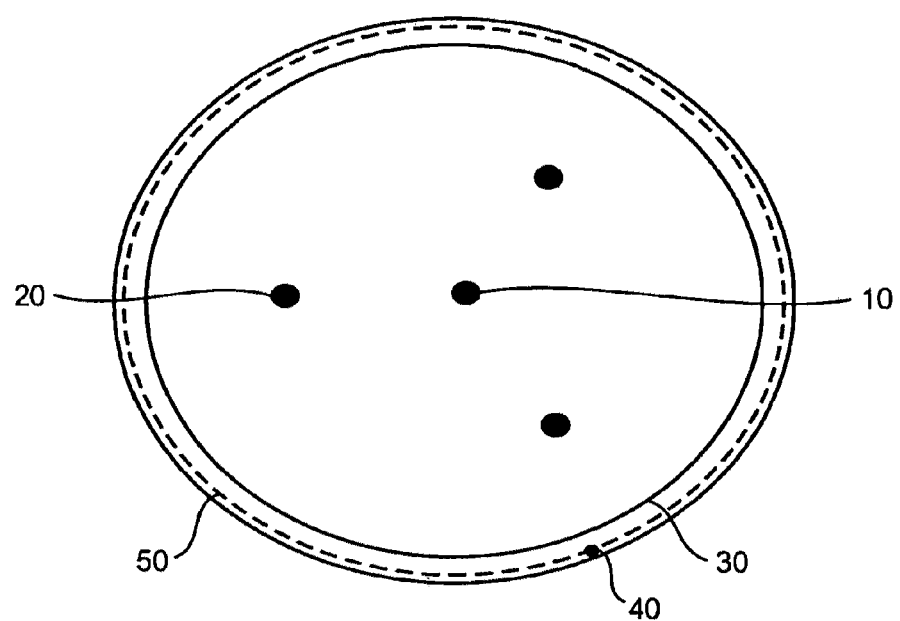
FIG. 3 is a top view of the ESC shown in FIG. 3, showing further exemplary areas of the ESC that may be analyzed before and after the cleaning.

FIG. 3, a top view of the ESC shown in FIG. 2, shows further exemplary areas of the ESC that may be analyzed before and after the cleaning. Such areas include a center area 10 of the ceramic surface, lift pin holes 20, an edge 30 of the ceramic surface, helium holes 40, and a helium holes groove 50.

Figure 4:
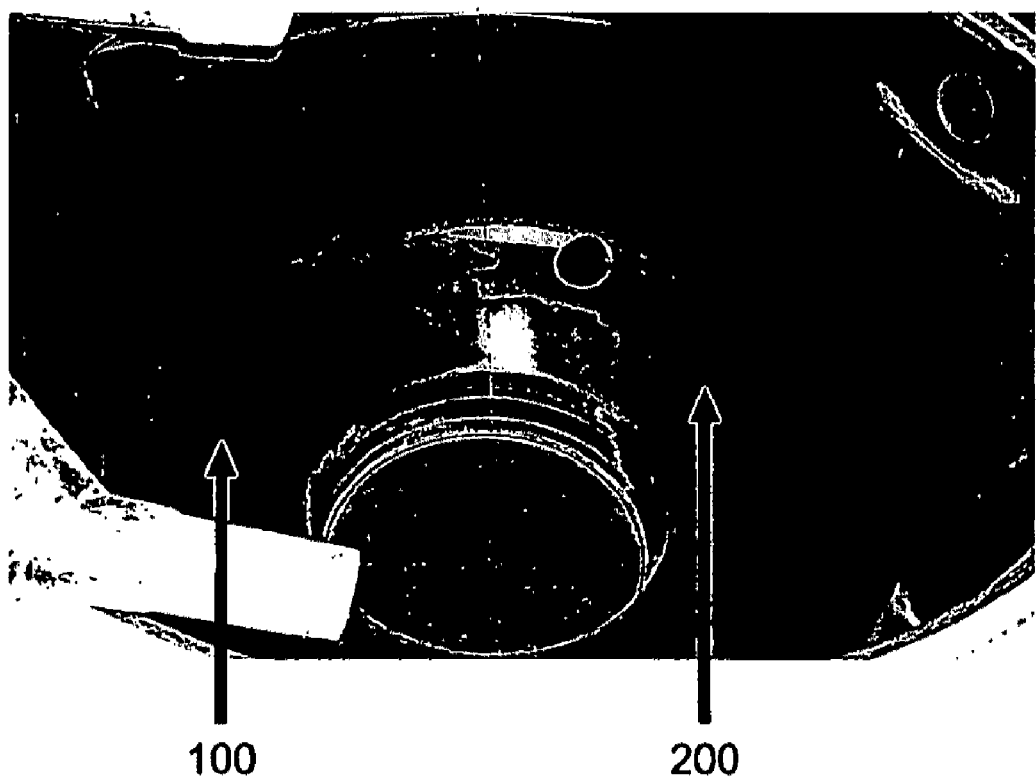
FIG. 4 is a photograph of a chamber component partially cleaned using carbon dioxide dry ice pellet technology.

FIG. 4 is a photograph of a chamber component partially cleaned on-line using carbon dioxide dry ice pellet technology. Specifically, region 100 is a section of chamber component not yet cleaned and containing polymer deposition, and region 200 is a section of the chamber component cleaned using carbon dioxide dry ice pellet technology and from which polymer deposition has been removed.

Figure 5C:
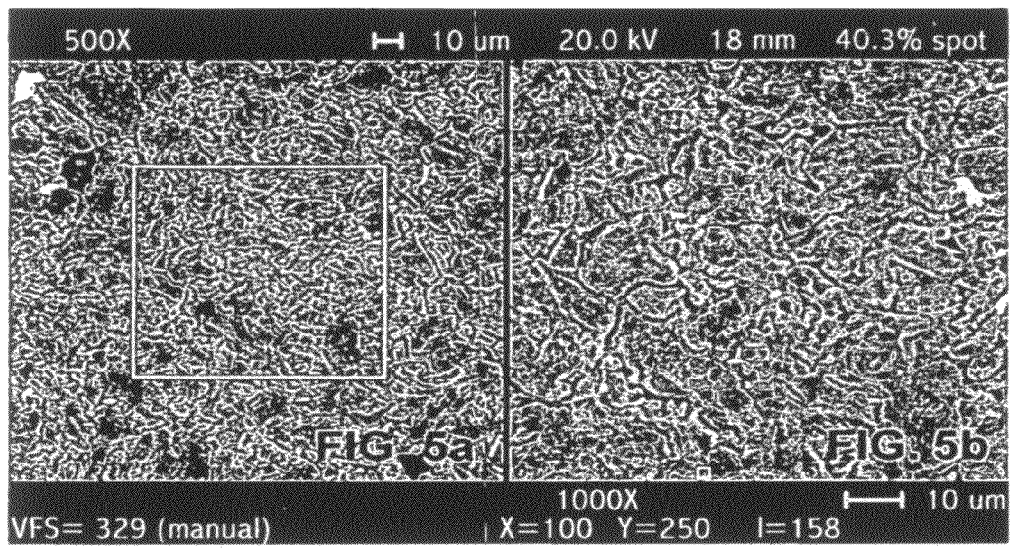
FIG. 5 is a Scanning Electron Microscope/Energy Dispersive X-ray Spectroscopy (SEM/EDS) analysis of an ESC ceramic surface after cleaning.
Figure 5C:
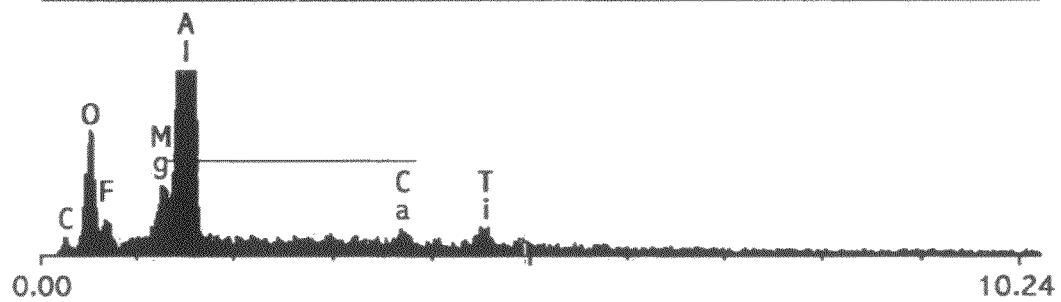

FIG. 5 is an SEM/EDS analysis at edge 30 of the ceramic surface after cleaning. FIG. 5a is the image at 100× magnification and FIG. 5b is the image at 500× magnification. FIG. 5c is the elemental analysis of the pictured area. FIG. 5c shows that while the dry ice blasting is efficient in polymer deposit removal, it is not as efficient in removal of inorganic metallic compounds (e.g., F, Mg, Al, Ca, Ti, etc.), for example, oxides thereof. Surprisingly, the surface morphology of the cleaned ceramic surface of the ESC previously used for mask open dielectric etch is similar to that of a new ESC. As SEM/EDS analysis can only be used as an off-line analysis method for surface cleanliness evaluation, it cannot be applied as an on-line evaluation tool, especially for large chamber body components.

While various embodiments have been described, it is to be understood that variations and modifications may be resorted to as will be apparent to those skilled in the art. Such variations and modifications are to be considered within the purview and scope of the claims appended hereto.

What is claimed is:

1. An on-line method of cleaning contaminants from at least one interior chamber surface in plasma chambers, the method comprising:
   opening a plasma chamber at an on-line site; and
   blasting one or more interior surfaces of the plasma chamber with dry ice, wherein:
   the blasting removes contaminants from the one or more surfaces; and
   the cleaning is carried out at the on-line site in which the plasma chamber is regularly operated.

2. The method of claim 1, wherein the contaminants comprise polymer deposits.

3. The method of claim 1, wherein the contaminants comprise carbon and fluorine based polymer deposits.

4. The method of claim 1, wherein the one or more surfaces are selected from the group consisting of stainless steel, ceramic, anodized aluminum, and combinations thereof.

5. The method of claim 1, wherein the one or more surfaces are selected from the group consisting of an anodized aluminum sidewall of the plasma chamber, an anodized aluminum surface of an electrostatic chuck, a ceramic surface of an electrostatic chuck, and combinations thereof.

6. The method of claim 1, further comprising removing contaminants cleaned from the one or more surfaces using a vacuum hose and/or a cleanroom exhaust.

7. The method of claim 1, further comprising wiping the interior surfaces of the plasma chamber with isopropyl alcohol subsequent to the blasting.

8. The method of claim 1, further comprising wiping the interior surfaces of the plasma chamber with ultra pure water subsequent to the blasting.

9. The method of claim 1, wherein the blasting is carried out using a blasting system comprising a dry ice source, clean dry air source, dry ice blast hose connected to the dry ice source, clean dry air hose connected to the clean dry air source, and dry ice blast applicator and nozzle connected to the dry ice blast hose and the clean dry ice hose.

10. The method of claim 9, wherein an operator holding the nozzle manually directs dry ice from the blasting system to blast the one or more surfaces.

11. The method of claim 9, wherein the blasting comprises an operator moving the nozzle to direct dry ice onto the one or more surfaces at a rate of about 2-15 inch.$^2$/min.

12. The method of claim 9, wherein the blasting comprises an operator moving the nozzle to direct dry ice onto the one or more surfaces at a rate of about 2-5 inch.$^2$/min.

13. The method of claim 9, wherein operating conditions of the blasting system include:
   Clean Dry Air pressure of about 25-125 psi; and
   Clean Dry Air flow rate of about 12-100 CFM.

14. The method of claim 9, wherein operating conditions of the blasting system include:
   dry ice blasting rate of about 0.3-1.0 lbs/min.;
   Clean Dry Air inlet diameter of about 0.5-1.0 inch; and
   a nozzle having a blast swath of about 0.125-1 inch.

15. The method of claim 14, wherein operating conditions of the blasting system include:
   dry ice blasting rate of about 0.5 lbs/min.
   Clean Dry Air inlet diameter of about 0.5 inch; and
   a nozzle having a blast swath of about 0.5 inch.

16. The method of claim 7, wherein the cleaning is carried out using only isopropyl alcohol.

17. The method of claim 10, further comprising supplying dry ice from the dry ice source, wherein dry ice is shaved from a block of dry ice.

18. The method of claim 1, wherein the plasma chamber comprises a plasma etch chamber.

19. The method of claim 1, wherein the plasma chamber comprises a chamber selected from the group consisting of a metal etch chamber, a poly etch chamber, a dielectric etch chamber, and a photoresist stripping chamber.

20. The method of claim 1, wherein the cleaning is carried out in a cleanroom.

* * * * *